US008766256B2

(12) United States Patent
Chen et al.

(10) Patent No.: US 8,766,256 B2
(45) Date of Patent: Jul. 1, 2014

(54) SIGE SRAM BUTTED CONTACT RESISTANCE IMPROVEMENT

(75) Inventors: Chao-Hsuing Chen, Tainan (TW); Ling-Sung Wang, Tainan (TW); Chi-Yen Lin, Tainan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 13/494,157

(22) Filed: Jun. 12, 2012

(65) Prior Publication Data

US 2013/0328127 A1 Dec. 12, 2013

(51) Int. Cl.
*H01L 21/336* (2006.01)

(52) U.S. Cl.
USPC .......................................................... 257/48

(58) Field of Classification Search
USPC .......................................................... 257/48
See application file for complete search history.

(56) References Cited

U.S. PATENT DOCUMENTS

| 6,339,229 | B1* | 1/2002 | Shiga et al. ..................... 257/48 |
| 6,833,595 | B1* | 12/2004 | Iwasaki ........................ 257/401 |
| 8,004,042 | B2* | 8/2011 | Yang et al. .................... 257/368 |
| 8,228,069 | B2* | 7/2012 | Lee et al. ...................... 324/522 |
| 2006/0192254 | A1* | 8/2006 | Yokoyama ................... 257/379 |
| 2006/0270071 | A1* | 11/2006 | Chang et al. .................. 438/14 |
| 2007/0080423 | A1* | 4/2007 | Tsuboi et al. ................ 257/506 |
| 2009/0002012 | A1* | 1/2009 | Doong et al. ................. 324/765 |
| 2009/0020755 | A1* | 1/2009 | Chung et al. ................... 257/48 |
| 2010/0013514 | A1* | 1/2010 | Lee et al. ...................... 324/765 |
| 2012/0119209 | A1* | 5/2012 | Lee ................................ 257/48 |
| 2013/0065329 | A1* | 3/2013 | Kronholz et al. .............. 438/14 |

* cited by examiner

*Primary Examiner* — Eugene Lee
(74) *Attorney, Agent, or Firm* — Eschweiler & Associates, LLC (57) ABSTRACT

The present disclosure relates to a device and method for fabricating a semiconductor memory device arrangement comprising a butted a contact arrangement configured to couple two transistors, wherein an active area of a first transistor is coupled to an active gate of a second transistor. The active gate of the second transistor is formed from a gate material which comprises a dummy gate of the first transistor, and is configured to straddle a boundary between the active area of the first transistor and an isolation layer formed about the first transistor. The butted a contact arrangement results in a decreased contact resistance for the butted contact as compared to previous methods.

12 Claims, 7 Drawing Sheets

SIGE SRAM BUTTED CONTACT RESISTANCE IMPROVEMENT

BACKGROUND

To achieve the continued scaling of semiconductor device density in accordance with Moore's law while maintaining or even exceeding current power and performance standards, new manufacturing methods have been introduced which target specific device performance parameters. Methods such as Hi-K metal gates to decrease device leakage, strain inducing channels for increased charge carrier mobility, and butted contacts for increased wiring density are a few examples of methods to continue Moore's Law scaling for next generation microprocessor designs.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Figure 1A:
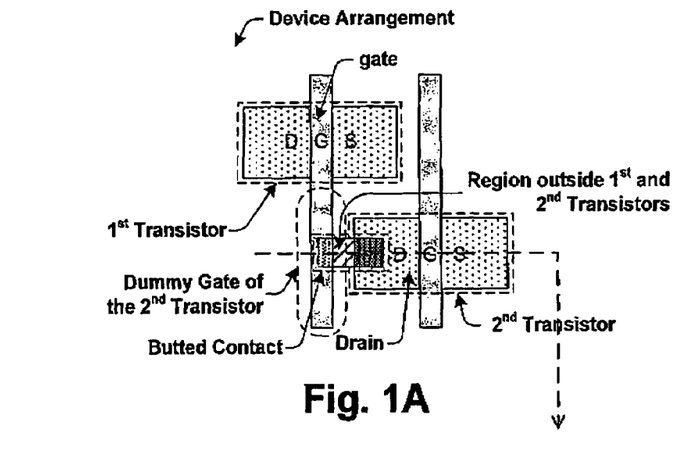
FIG. 1A illustrates a semiconductor device arrangement for coupling of transistors.

FIG. 1A illustrates a semiconductor device arrangement 100a for coupling of transistors, comprising a first transistor 102a and a second transistor 104a. In certain circuit applications it is desired to couple the gate 106a of the first transistor 102a to the drain 108a of the second transistor 104a. In general the coupling of two transistors may be achieved by connecting them through a metallization layer (not shown). However, the area overhead involved with utilizing the metallization layer may be overly-restrictive for dense circuit applications such as Static Random-Access Memory SRAM or embedded Dynamic Random-Access Memory (eDRAM) layouts. As such, a more area-efficient method is desired. One method to optimize area-efficiency is to utilize a butted contact 110a to tie the gate 106a (e.g., a gate material that forms the gate 106a of the first transistor 102a and a dummy gate 107a of the second transistor 104a) to the drain 108a. It will be appreciated to one of skill in the art that a butted contact may be utilized in general for coupling of a terminal of a first transistor to a terminal of a second transistor, wherein a terminal comprises a source, a drain, a gate, or any combination thereof.

To achieve the desired electrical performance, a low contact resistance is desired between the butted contact 110a and the terminal that it touches. For the semiconductor device arrangement 100a the butted contact 110a not only touches the gate 106a and the drain 108a, but also a region 112a outside both the first transistor 102a and the second transistor 104a, adding contact resistance to the butted contact 110a.

Figures 1B, 1D:
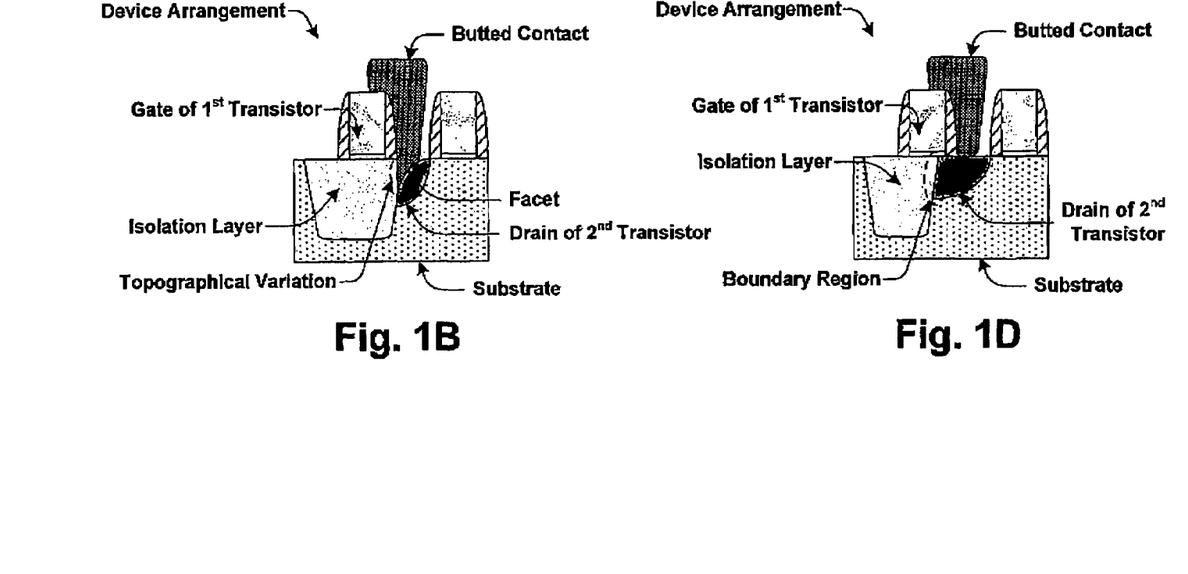
FIG. 1B illustrates a cross-sectional view of a semiconductor device arrangement wherein a butted contact couples a gate of a first transistor to a drain of a second transistor.
FIG. 1D illustrates a cross-sectional view of a semiconductor device arrangement wherein a butted contact couples a gate of a first transistor to a drain of a second transistor.

FIG. 1B illustrates a cross-sectional view 100b of the semiconductor device arrangement 100a formed on a substrate 114b, wherein a butted contact 110b couples a gate 106b (e.g., a gate material) of a first transistor to a drain 108b of a second transistor. An isolation layer 112b surrounds and abuts the drain 108b in a manner to isolate it from other devices on the substrate 114b. For certain types of source/drain materials (e.g., strained SiGe), a facet 116b may form on an edge of the drain 108b at an interface to the isolation layer 112b. As a result, the butted contact 110b does not have a smooth surface on which to land, but rather topographical variation 118b around the facet 116b. The butted contact 110b therefore forms such that it fills in the topographical variation 118b and touches both the facet 116b on an edge of the drain 108b as well as the isolation layer 112b. This results in an increased contact resistance of the butted contact 110b. The increased contact resistance demonstrates measured values of between approximately 6,000Ω and approximately 60,000Ω as opposed to a measured value of approximately 60Ω for a well-formed contact.

Accordingly, the present disclosure relates to a device and method for fabricating a semiconductor memory device arrangement comprising a butted a contact arrangement configured to couple two transistors, wherein an active area of a first transistor is coupled to an active gate of a second transistor. The active gate of the second transistor is formed from a gate material which comprises a dummy gate of the first transistor, and is configured to straddle a boundary between the active area of the first transistor and an isolation layer formed about the first transistor. The butted a contact arrangement results in a decreased contact resistance for the butted contact as compared to previous methods.

Figure 1C:
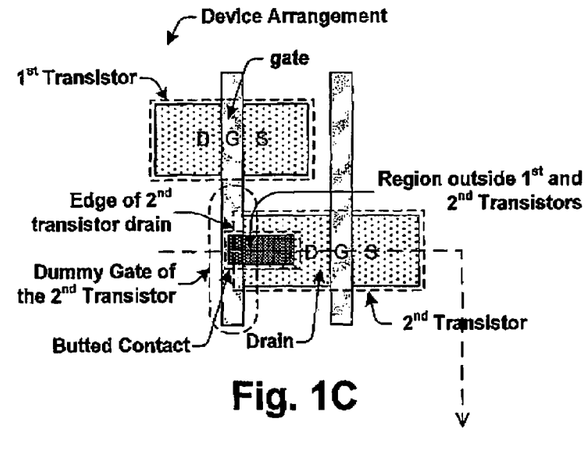
FIG. 1C illustrates some embodiments of a semiconductor device arrangement for coupling of transistors.

FIG. 1C illustrates some embodiments of a semiconductor device arrangement 100c for coupling of transistors comprising a first transistor 102c and a second transistor 104c, wherein a drain 108c of the second transistor 104c has been extended such that its edge 120c lies under a gate material that forms the gate of the first transistor 102c and a dummy gate 107c of the second transistor 104c. For the semiconductor device arrangement 100c the butted contact 110c touches only the gate 106c and the drain 108c.

FIG. 1D illustrates some embodiments of a cross-sectional view 100d of the semiconductor device arrangement 100c formed on a substrate 114d, wherein a butted contact 110d couples a gate 106d of a first transistor to a drain 108d of a second transistor. An isolation layer 112d surrounds and abuts the drain 108d in a boundary region 122d formed under the gate 106d. Unlike the cross-sectional view 100b, wherein the facet 116b resulted in topographical variation 118b, the embodiments of a cross-sectional view 100d result in a relatively flat interface between the butted contact 110d and the drain 108d due to the formation of the boundary region 122d under the gate 106d. This results in a decreased contact resistance of approximately 60Ω for the butted contact 110b.

Figure 2:
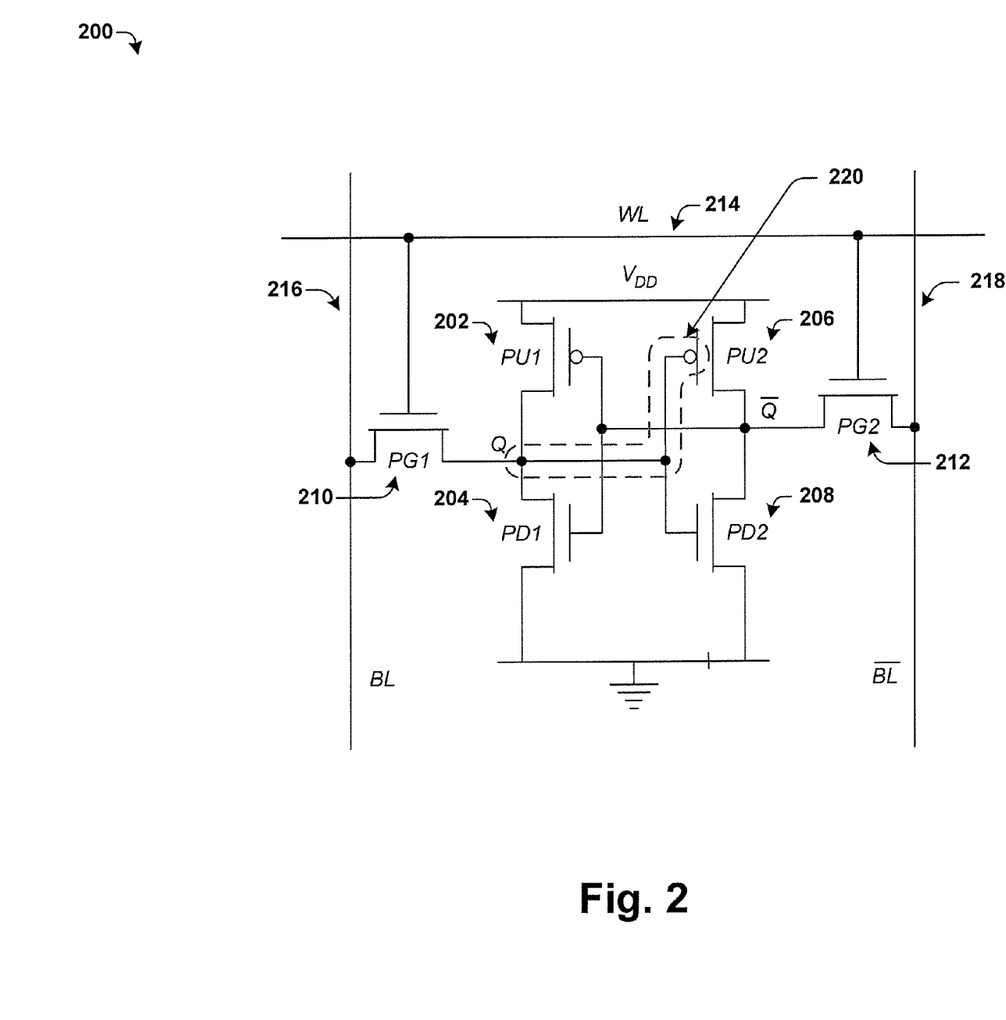
FIG. 2 illustrates an SRAM memory cell schematic.

FIG. 2 illustrates an SRAM memory cell schematic 200, comprising storage cell comprising two cross-coupled inverters, a first inverter comprising a first p-type Field-Effect Transistor (PFET) 202 and a first n-type Field-Effect Transistor (NFET) 204, and a second inverter comprising a second p-type Field-Effect Transistor (PFET) 206 and a second n-type Field-Effect Transistor (NFET) 208. A third NET 210 and a forth NFET 212 control access to a storage cell through a word line (WL) 214 which is coupled to their gates, thus controlling whether the storage cell is connected to a first bit line (BL) 216 and a second bit line ($\overline{BL}$) 218. To achieve scaling of an SRAM memory cell layout corresponding to the SRAM memory cell schematic 200 in accordance with Moore's law, a butted contact may be used to form a coupling connection 220 between the cross-coupled inverters (shown here as a connection between a drain of the first PFET 202 and a gate of the second PFET 206).

Figure 3A:
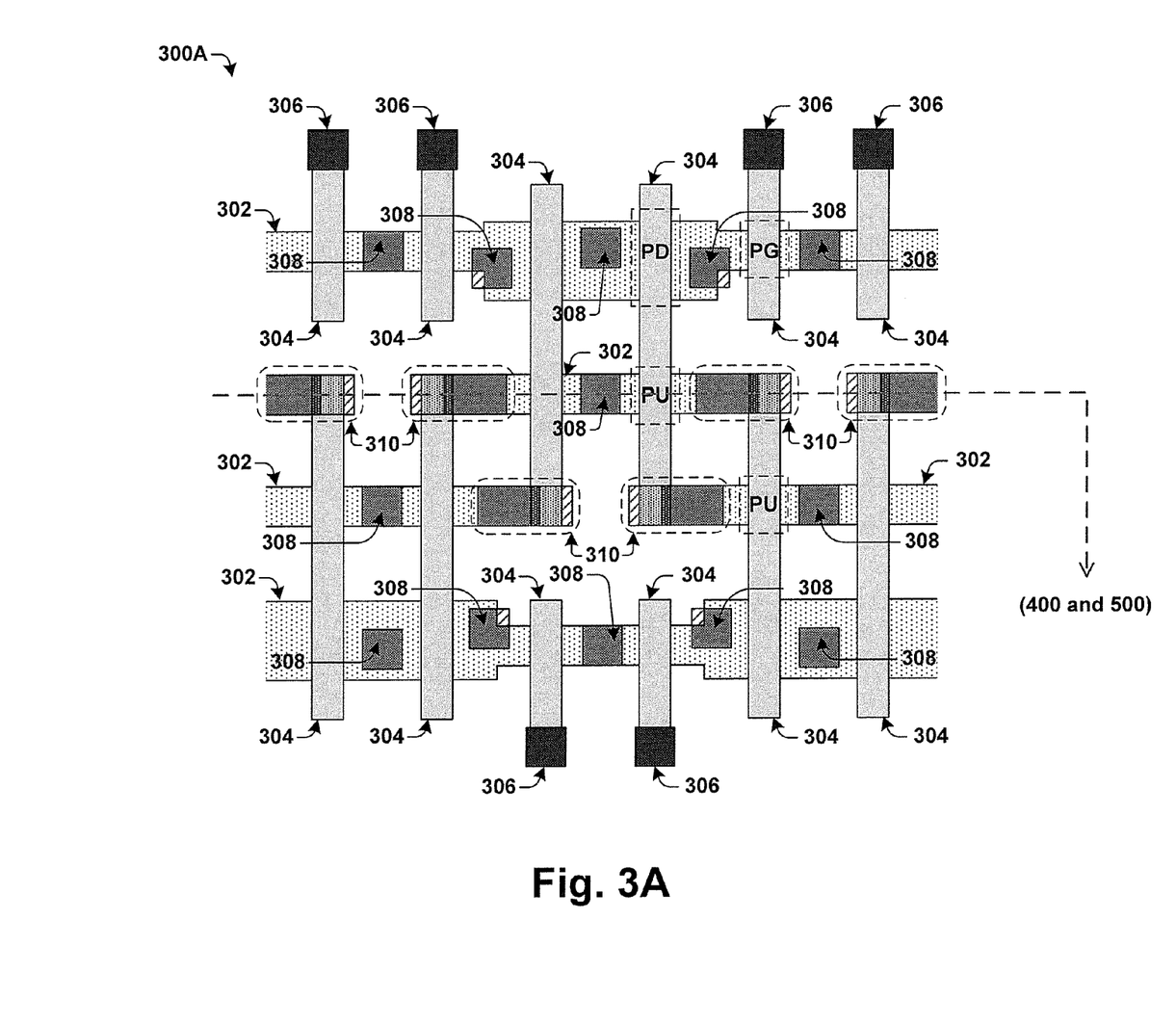
FIG. 3A illustrates an SRAM memory cell layout.
Figure 3B:
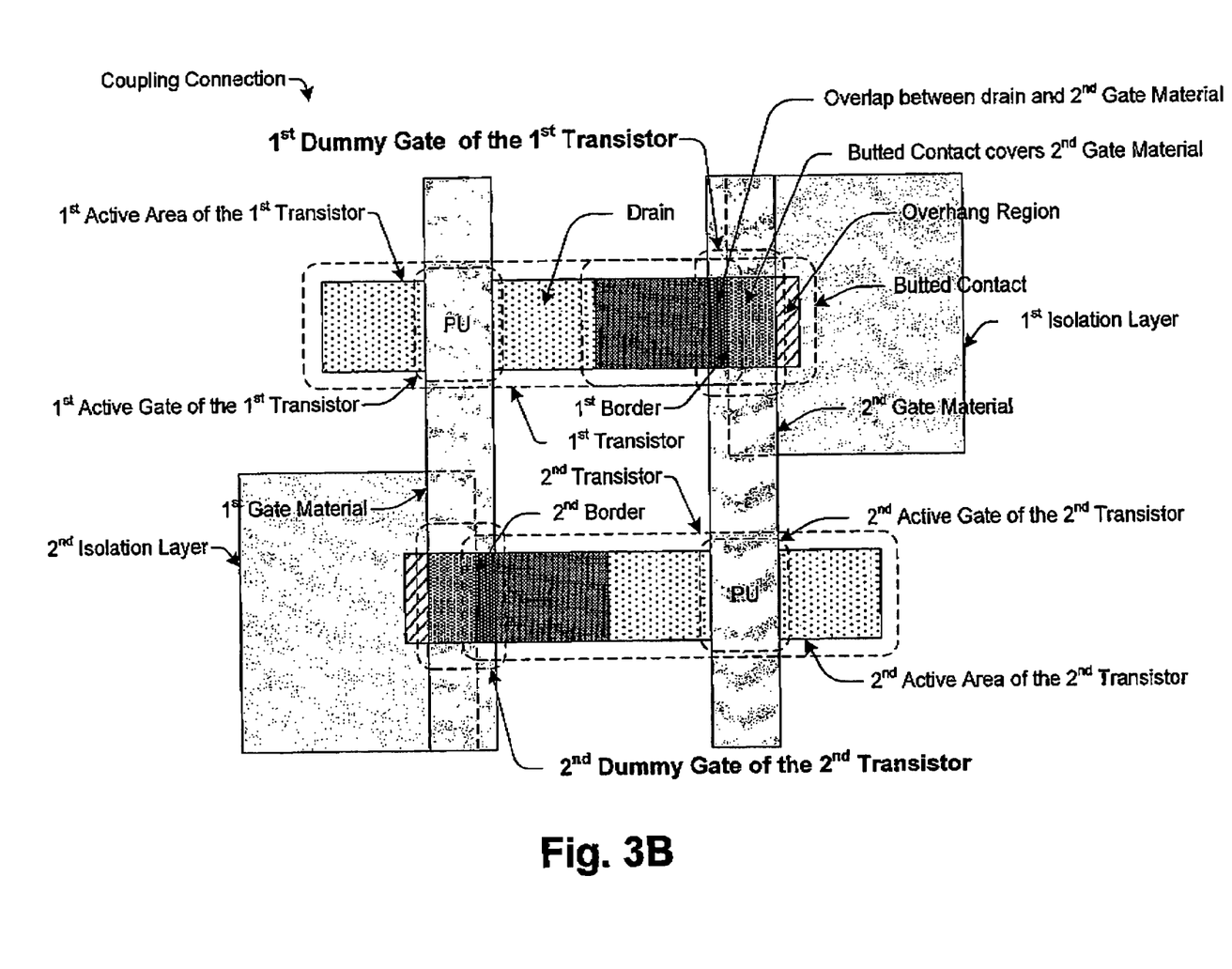
FIG. 3B illustrates an exploded view of a coupling connection formed between a first pull up transistor and a second pull up transistor.

FIG. 3A illustrates an SRAM memory cell layout 300A, comprising a plurality of active areas 302, a plurality of gate materials 304, a plurality of world line contacts (e.g., gate contacts) 306, a plurality of active area contacts (e.g., source/drain contacts) 308, and a plurality of butted contacts 310 which form coupling connections between a drain of a first transistor and a gate of a second transistor. FIG. 3B illustrates an exploded view of a coupling connection 300B formed by a butted contact 310B between a first pull up transistor 312 comprising a first gate material 330 disposed over a first active area 342 and a second pull up transistor 314 comprising a second gate material 318 disposed over a second active area 326. A drain 316 of the first pull up transistor 312 formed in the first active area 342 has been extended such that it overlaps the second gate material 318 by an overlap value 320. The first gate material 330 forms a first active gate 332 of the first pull up transistor 312 and a second dummy gate 334 of the second pull up transistor 314. Likewise, the second gate material 318 forms a second active gate 328 of the second pull up transistor 314, and a first dummy gate 338 of the first pull up transistor 312. The butted contact 310B covers the second gate material 318 (322) and overlaps it extends past the second gate material 318 in an overhang region 324. As will be demonstrated in subsequent embodiments, while the butted contact 310B of this embodiment extends past the second gate material 318, the overhang region 324 is small enough such that a taper angle of the butted contact 310B will only contact the second gate material 318 in the overhang region 324. A first isolation layer 336 is formed beneath the first dummy gate 338, and a first border 340 is formed between the first active area 342 and the first isolation layer 336. Likewise, a second border 342 is formed between the second active area 326 and a second isolation layer 338 formed beneath the second dummy gate 334. Also, the butted contact 310B is configured to couple the first active area 342 to the second active gate 328 by contacting the first active area 342 and the second gate material 318.

The performance of a Field-Effect Transistor (FET) may be enhanced by increasing the mobility of charge carriers with source and drain regions of the FET. One method to achieve this is to produce a strain inducing or high mobility layer within the source and drain regions. However, a strain inducing or high mobility layer (e.g., SiGe, Ge, or Si) formed near the interface between an active area and an isolation layer may result in a facet an edge of the active area at an interface of an isolation layer. The resulting topographical variation near the interface region results in a poor contact area, and increased contact resistance. As such, moving the interface region under an adjacent dummy gate (either through process tuning or layout design) results in a relatively smooth contact surface, increasing electrical performance without impacting the function of the FET.

Figure 4:
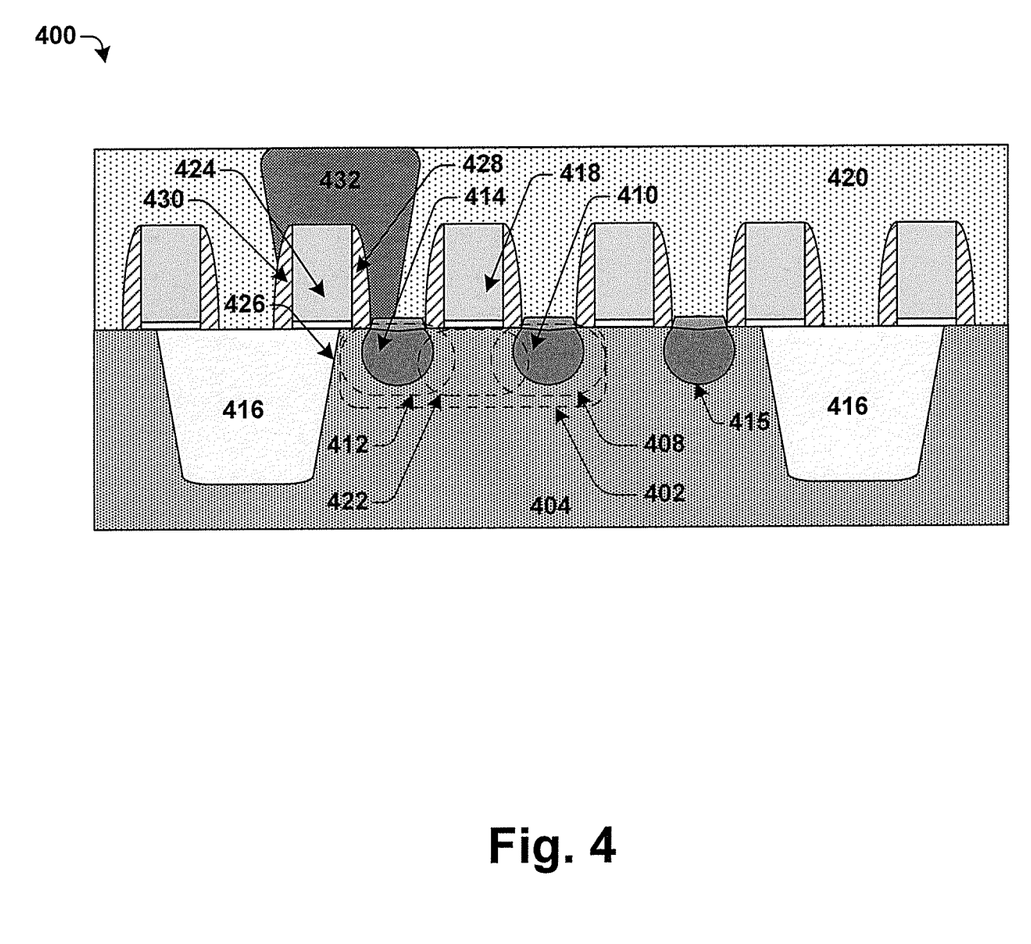
FIG. 4 illustrates some embodiments of a cross-sectional view of a coupling connection formed in an SRAM memory cell layout.

FIG. 4 illustrates some embodiments of a cross-sectional view 400 of a coupling connection formed in the SRAM memory cell layout 300A, comprising an active area 402 formed within a substrate 404 (e.g., Si) and surrounded by an isolation layer 406 (e.g., a shallow trench isolation, or STI formed from an oxide material such as $SiO_2$), which abuts the active area and isolates it from other regions of the substrate 404. The active area 402 comprises a source region 408, which comprises a first strain inducing or high mobility layer 410, and a drain region 412, which comprises a second strain inducing or high mobility layer 414. Both the first strain inducing or high mobility layer 410 and the second strain inducing or high mobility layer 414 comprise an isotropic profile 415, and may be formed by performing a wet chemical etch, a dry chemical etch, or a combination thereof, within the substrate 404 to produce a recess (with a profile depth of approximately 30 nm-100 nm). The recess is then filled with a respective strain inducing or high mobility layer which may be grown epitaxially on the substrate 404.

A first active gate 418, that controls the flow of charge carriers from the source region 408 to the drain region 412, is formed within an inter-layer dielectric (ILD) 420 and disposed over a channel region 422 that separates the source region 408 and the drain region 412. A dummy gate 424 straddles a boundary 426 between the active area 402 and the isolation layer 416 at the surface of the substrate 404. The dummy gate 424 is abutted on one side by a first sidewall spacer 428 which also buts the active area 402, and abutted on an opposite side by a second sidewall spacer 430 which also abuts the isolation layer 416. Note that the boundary 426 between the active area 402 and the isolation layer 416 does not touch the first sidewall spacer 428 or second sidewall spacer 430, but has been moved completely under the dummy gate 424. A butted contact 432 is disposed to couple the drain region 412 to the dummy gate 424, which forms a second active gate elsewhere on the substrate 404.

Figure 5:
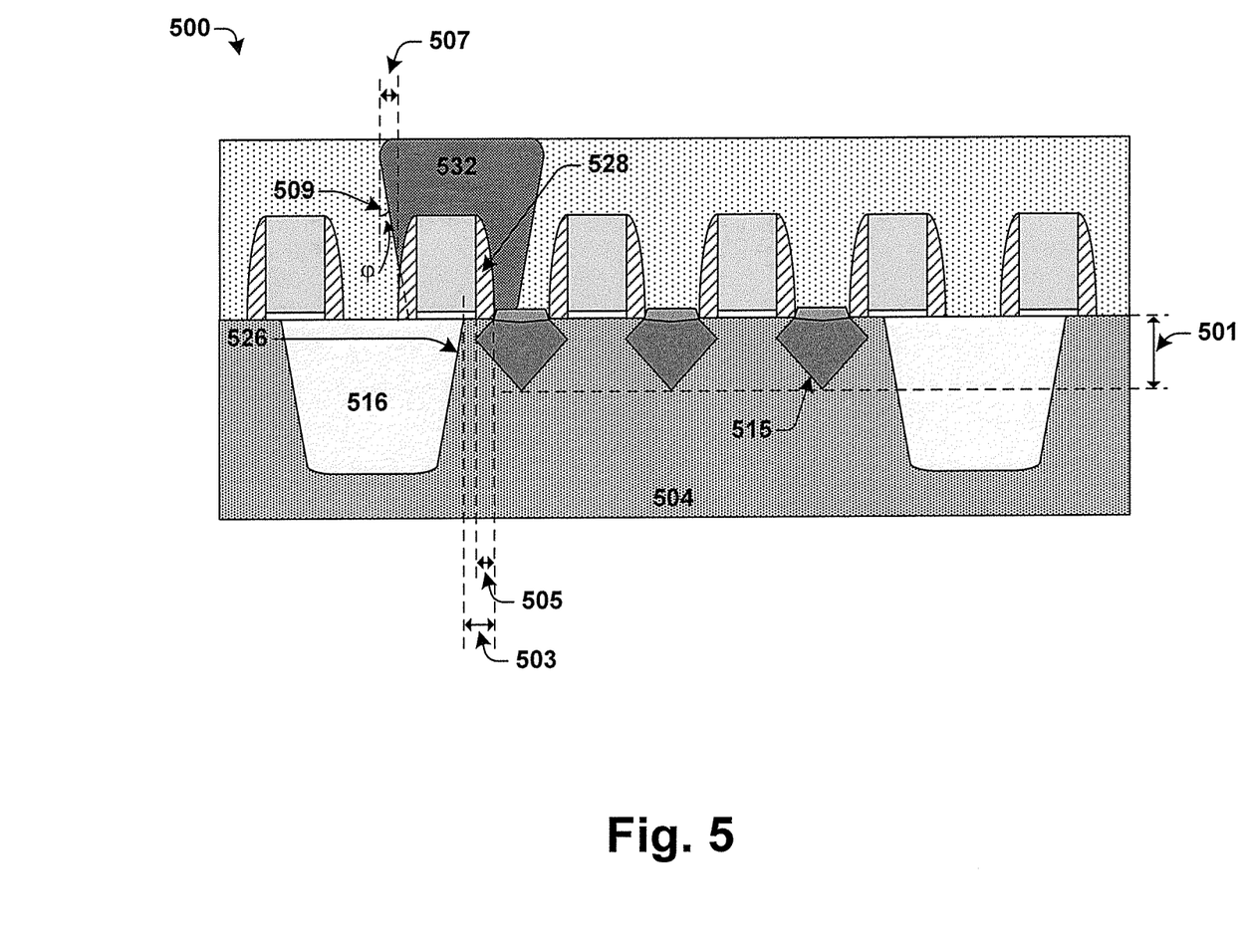
FIG. 5 illustrates some embodiments of a cross-sectional view of a coupling connection formed in an SRAM memory cell layout.

FIG. 5 illustrates some embodiments of a cross-sectional view 500 of a coupling connection formed in the SRAM memory cell layout 300A. Note that the embodiments of FIG. 5 are identical to the embodiments of FIG. 4 with the exception that a respective strain inducing or high mobility layer comprises an anisotropic profile 515. The anisotropic profile 515 may comprise a recess, with a profile depth 501 of approximately 30 nm-100 nm, formed a wet chemical etch, a dry chemical etch, plasma etch, or a combination thereof, that has been filled (e.g., epitaxial growth) by a respective strain inducing or high mobility layer. For additional clarity, it will be appreciated that the embodiments of the cross-sectional view 500 also demonstrate that a first overlap 503 of a boundary 526 between an active area 502 and the isolation layer 516 at the surface of the substrate 504 that is larger than a width of the first sidewall spacer 528 (of approximately 10 nm-30 nm). Also, the overhang region 507 of the butted contact 532 is small enough such that a sidewall taper angle ($\phi$) 509 prevents the butted contact 532 from contacting an isolation layer 516.

Figure 6:
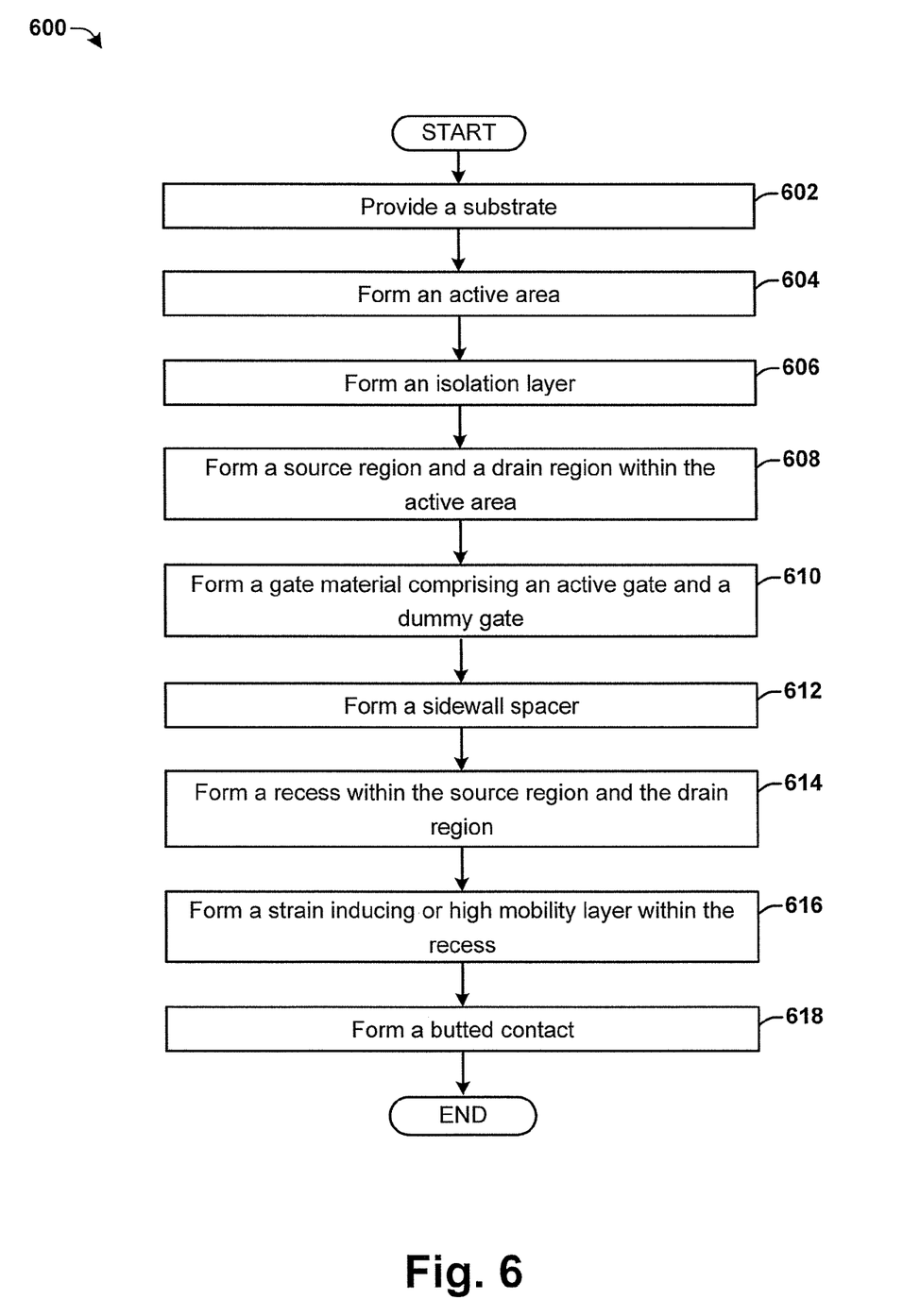
FIG. 6 illustrates a flow diagram of some embodiments of a method for fabricating a semiconductor memory device arrangement with butted a contact arrangement for coupling transistors.

FIG. 6 illustrates a flow diagram of some embodiments of a method 600 for fabricating a semiconductor memory device arrangement with butted a contact arrangement for coupling transistors. While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 602 a substrate is provided. The substrate may comprise a 300 mm or 450 mm crystalline wafer comprising silicon that has been doped with boron, phosphorus, arsenic, or antimony.

At step 604 an active area is formed within the substrate; and may comprise doping of the substrate.

At step 606 an isolation layer is formed within the substrate and configured to isolate the active area. The isolation layer may comprise an oxide layer (e.g., $SiO_2$) configured to electrically isolate the active area from other devices formed on the substrate.

At step 608 a source region and a drain region are formed within the active area, and may comprise doping of the active area.

At step 610 a gate material is formed on the substrate. The gate material comprises an active gate of a first semiconductor memory device formed above the active area and between the source region and the drain region, and a dummy gate formed above a boundary between the active area and the isolation layer, straddling both the active area and the isolation layer. The dummy gate further comprises an active gate of a second semiconductor memory device. The gate material may comprise a layer of Poly-Silicon above a layer of gate dielectric, wherein the gate dielectric which may comprise $SiO_2$ or a Hi-K dielectric.

At step 612 a sidewall spacer is formed which abuts the gate material, the sidewall spacer may comprise a dielectric configured to isolate the active gate from the source region and the drain region.

At step 614 a recess is formed within the source region and the drain region by a wet chemical etch, a dry chemical etch, plasma etch, or a combination thereof. The recess may comprise an isotropic etch profile or an anisotropic etch profile.

At step 616 a strain inducing layer or high mobility layer is formed in the recess. The strain inducing layer or high mobility layer may comprise a layer of epitaxial SiGe (e.g., $SiGe_{0.3}$), and is configured to provide increased charge carrier mobility.

At step 618 a butted contact is formed, and configured to couple the source region or the drain region of the first semiconductor memory device to the active gate of the second semiconductor memory device. The butted contact may comprise a layer of tungsten.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a device and method for fabricating a semiconductor memory device arrangement comprising a butted a contact arrangement configured to couple two transistors, wherein an active area of a first transistor is coupled to an active gate of a second transistor. The active gate of the second transistor is formed from a gate material which comprises a dummy gate of the first transistor, and is configured to straddle a boundary between the active area of the first transistor and an isolation layer formed about the first transistor. The butted a contact arrangement results in a decreased contact resistance for the butted contact as compared to previous methods.

In some embodiments the present disclosure relates to a method for fabricating a semiconductor memory device arrangement. An active area is formed within a substrate, and surrounded by an isolation layer to isolate the active area. A source region and a drain region are then formed within the active area. A gate material is formed on the substrate, comprising an active gate formed above the active area and disposed between the source region and the drain region, and a dummy gate formed above a boundary between the active area and the isolation layer, straddling both the active area and the isolation layer such that no facet forms at the boundary. A sidewall spacer is abutted to the gate material, wherein the sidewall spacer is configured to isolate the active gate from the source region and the drain region. For increased carrier mobility, a recess is formed within the source region and the drain region, and filled with a strain inducing or high mobility layer. A butted contact then couples a source region or a drain region of a first semiconductor memory device to an active gate of a second semiconductor memory device, resulting in a low contact resistance of the butted contact.

In some embodiments the present disclosure relates to a butted contact arrangement for coupling transistors, comprising a first gate material disposed over a first active area to form a first active gate of a first transistor and a first dummy gate of second transistor, and a second gate material disposed over a second active area to form a second active gate of a second transistor and a second dummy gate of first transistor. The butted contact arrangement for coupling transistors further comprises a border formed between the first active area and a first isolation layer formed beneath the second dummy gate, a border formed between the second active area and a second isolation layer formed beneath the first dummy gate, and a butted contact configured to couple the first active area of the first transistor to the second active gate of the second transistor by contacting the second gate material. The butted contact arrangement may further comprise a first sidewall spacer that abuts the second dummy gate and the first active area, and a second sidewall spacer abuts the second dummy gate and the first isolation layer, such that the first sidewall spacer does not touch the first isolation layer and the second sidewall spacer does not touch the first active area. An overlap of a respective dummy gate and respective active area of the butted contact arrangement may comprise a value that is larger than a width of a respective sidewall spacer. The butted contact arrangement may connect a first PFET source region or drain region to a second PFET active gate, wherein the first PFET source region or drain region comprises a strain inducing or high mobility layer, and may further comprise an isotropic profile or an anisotropic profile.

In some embodiments the present disclosure relates to a semiconductor memory device arrangement comprising, an active area, an isolation layer outside and abutting the active area configured to isolate the active area, and a source region and a drain region formed in the active layer, each comprising a strain inducing or high mobility layer. An active gate is disposed over a channel region that separates the source region and the drain region. A dummy gate straddles a boundary between the active area and the isolation layer, a respective dummy gate comprising, a first sidewall spacer which abuts the dummy gate and the active region, and a second sidewall spacer which abuts the dummy gate and the isolation layer, with a respective sidewall spacer comprising a sidewall spacer width of approximately 10 nm-30 nm. A butted contact is disposed and configured to couple a source region or a drain region of a first semiconductor memory device to an active gate of a second semiconductor memory device. For reduced contact resistance of approximately 60Ω, an overlap of a respective dummy gate and the active area comprises a value that is larger than a sidewall spacer width of a sidewall spacer. A respective strain inducing or high mobility layer may comprise a profile depth of approximately 30 nm-100 nm with an isotropic profile or an anisotropic profile filled with epitaxially-grown SiGe, Ge, Si, or any combination thereof.

What is claimed is:

1. A butted contact arrangement for coupling transistors, comprising;
    a first gate material disposed over a first active area to form a first active gate of a first transistor and a second dummy gate of a second transistor;
    a second gate material disposed over a second active area to form a second active gate of a second transistor and a first dummy gate of first transistor; and
    a butted contact configured to couple the first active area of the first transistor to the second active gate of the second transistor by contacting the first active area and the second gate material associated with the first dummy gate.

2. The butted contact arrangement of claim 1, further comprising;
    a first border between the first active area and a first isolation layer formed beneath the first dummy gate; and
    a second border between the second active area and a second isolation layer formed beneath the second dummy gate.

3. The butted contact arrangement of claim 2, comprising a first sidewall spacer that abuts the second dummy gate and the first active area, and a second sidewall spacer abuts the second dummy gate and the first isolation layer, such that the first sidewall spacer does not touch the first isolation layer and the second sidewall spacer does not touch the first active area.

4. The butted contact arrangement of claim 3, wherein an overlap of a respective dummy gate and respective active area comprises a value that is larger than a width of a respective sidewall spacer.

5. The semiconductor memory device arrangement of claim 4, wherein the width of a respective sidewall spacer is in a range of about 10 nm to about 30 nm.

6. The butted contact arrangement of claim 1, wherein the butted contact connects a first PFET source or drain to a second PFET active gate.

7. The butted contact arrangement of claim 1, wherein a respective active area comprises a source region and a drain region each comprising a strain inducing or high mobility layer, and separated by a respective active gate.

8. The butted contact arrangement of claim 7, wherein the strain inducing or high mobility layer comprises an isotropic profile.

9. The butted contact arrangement of claim 7, wherein the strain inducing or high mobility layer comprises an anisotropic profile.

10. The semiconductor memory device arrangement of claim 7, wherein the strain inducing or high mobility layer comprises a profile depth in a range of about 30 nm to about 100 nm.

11. The semiconductor memory device arrangement of claim 7, wherein the strain inducing or high mobility layer comprises SiGe, Ge, Si, or any combination thereof.

12. The butted contact arrangement of claim 1, wherein the butted contact connects a first NFET source or drain to a second NFET active gate.

* * * * *

UNITED STATES PATENT AND TRADEMARK OFFICE
CERTIFICATE OF CORRECTION

PATENT NO. : 8,766,256 B2  
APPLICATION NO. : 13/494157  
DATED : July 1, 2014  
INVENTOR(S) : Chao-Hsuing Chen et al.

It is certified that error appears in the above-identified patent and that said Letters Patent is hereby corrected as shown below:

In the Claims

Claim 1, Column 7, line 24; replace "comprising;" with --comprising:--

Claim 1, Column 7, line 30; replace "of first transistor" with --of the first transistor--

Claim 2, Column 7, line 36; replace "comprising;" with --comprising:--

Claim 5, Column 8, line 14; replace "semiconductor memory device" with --butted contact--

Claim 10, Column 8, line 30; replace "semiconductor memory device" with --butted contact--

Claim 11, Column 8, line 34; replace "semiconductor memory device" with --butted contact--

Signed and Sealed this  
Fourteenth Day of October, 2014

Michelle K. Lee  
*Deputy Director of the United States Patent and Trademark Office*